(12) United States Patent
Holm et al.

(10) Patent No.: US 9,720,051 B2
(45) Date of Patent: Aug. 1, 2017

(54) SENSOR PACKAGE INCLUDING A MAGNETIC FIELD SENSOR AND A CONTINUOUS COIL STRUCTURE FOR ENABLING Z-AXIS SELF-TEST CAPABILITY

(71) Applicants: Paige M. Holm, Phoenix, AZ (US); Lianjun Liu, Chandler, AZ (US)

(72) Inventors: Paige M. Holm, Phoenix, AZ (US); Lianjun Liu, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 253 days.

(21) Appl. No.: 14/290,040

(22) Filed: May 29, 2014

(65) Prior Publication Data

US 2015/0346290 A1 Dec. 3, 2015

(51) Int. Cl.
- *G01R 33/09* (2006.01)
- *G01R 33/00* (2006.01)
- *G01R 35/00* (2006.01)

(52) U.S. Cl.
CPC ......... *G01R 33/0023* (2013.01); *G01R 33/09* (2013.01); *G01R 35/005* (2013.01)

(58) Field of Classification Search
CPC ... G01R 33/0023; G01R 33/09; G01R 35/005
USPC .................................................. 324/244, 252
See application file for complete search history.

(56) References Cited

U.S. PATENT DOCUMENTS

| | | | |
|---|---|---|---|
| 7,619,407 B2 * | 11/2009 | Guo | G01B 7/30 324/207.21 |
| 8,447,556 B2 | 5/2013 | Friedrich et al. | |
| 8,847,586 B2 * | 9/2014 | Suzuki | G01R 35/00 324/224 |
| 2010/0188078 A1 * | 7/2010 | Foletto | G01R 33/0005 324/251 |
| 2011/0074406 A1 | 3/2011 | Mather et al. | |
| 2011/0169488 A1 | 7/2011 | Mather | |
| 2012/0293164 A1 | 11/2012 | Liou et al. | |
| 2012/0299587 A1 | 11/2012 | Rieger et al. | |

(Continued)

OTHER PUBLICATIONS

Asahi Kasei, "3-Axis Electronic Compass" Product Description, May 2010, pp. 1-34.

(Continued)

*Primary Examiner* — Jay Patidar
(74) *Attorney, Agent, or Firm* — Charlene R. Jacobsen

(57) ABSTRACT

A magnetic field sensor includes in-plane sense elements located in a plane of the magnetic field sensor and configured to detect a magnetic field oriented perpendicular to the plane. A current carrying structure is positioned proximate the magnetic field sensor and includes at least one coil surrounding the in-plane sense elements. An electric current is applied to the coil to create a self-test magnetic field to be sensed by the sense elements. The coil may be vertically displaced from the plane in which the sense elements are located and laterally displaced from an area occupied by the sense elements to produce both Z-axis magnetic field components and lateral magnetic field components of the self-test magnetic field. The sense elements are arranged within the coil and interconnected to cancel the lateral magnetic field components, while retaining the Z-axis magnetic field components to be used for self-test of the magnetic field sensor.

11 Claims, 10 Drawing Sheets

(56) References Cited

U.S. PATENT DOCUMENTS

| | | | |
|---|---|---|---|
| 2013/0038321 A1* | 2/2013 | Suzuki | G01R 35/00 324/224 |
| 2013/0221949 A1 | 8/2013 | Liu et al. | |
| 2013/0300402 A1 | 11/2013 | Liu et al. | |

OTHER PUBLICATIONS

Bosch, "BMM150 Geomagnetic Sensor" Data Sheet, Apr. 25, 2013, pp. 1-56.
Robert Racz et al., "Electronic Compass Sensor", IEEE, 2004, pp. 1446-1449, Switzerland.

* cited by examiner

SENSOR PACKAGE INCLUDING A MAGNETIC FIELD SENSOR AND A CONTINUOUS COIL STRUCTURE FOR ENABLING Z-AXIS SELF-TEST CAPABILITY

TECHNICAL FIELD OF THE INVENTION

The present invention relates generally to magnetoelectronic devices. More specifically, the present invention relates to a magnetic field sensor having Z-axis self-test capability.

BACKGROUND OF THE INVENTION

Magnetic field sensors, also known as magnetometers, are widely used in a number of applications including in, for example, compass, security, and military applications, geophysics and space research, biomagnetism and medical applications, and non-destructive testing. Magnetic field sensors are typically based on semiconductor materials (e.g., Hall sensors, semiconductor magnetoresistors, and so forth) and ferromagnetic materials (e.g., ferromagnetic magnetoresistors and flux guides). Other magnetic field sensors utilize optical, resonant, and superconducting properties. Magnetic field sensors may be designed to sense magnetic fields along one or more mutually exclusive axes, typically referred to as the X-axis, Y-axis, and Z-axis.

Increasingly, designers and manufacturers of magnetic field sensors are implementing self-test capability into magnetic field sensors which can be used to test proper operation of the sensors and/or to allow sensor self-calibration. What is absent in some prior art sensors is the ability to perform a true self-test of the magnetic field sensors. That is, currently implemented self-test in some Z-axis magnetic field sensors excludes the interaction between all of the related elements in order to check for sensor functionality and/or for sensitivity calibration. Thus, what is needed is self-test capability for Z-axis magnetic field sensors that includes the interaction between out-of-plane elements and in-plane detectors to enable a more complete and accurate evaluation of a Z-axis magnetic field sensor.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

A magnetic field sensor with Z-axis self-test capability and methodology for performing Z-axis self-test of the magnetic field sensor are provided. More particularly, the magnetic field sensor includes a current carrying coil structure surrounding in-plane magnetoresistive sense elements. The coil structure produces a vertical (i.e., out-of-plane) magnetic field component across the active sensor region to properly stimulate all components of the Z-axis magnetic sensor. A specific Wheatstone bridge configuration of the in-plane magnetoresistive sense elements and the locations of the in-plane magnetoresistive sense elements within the coil structure provide common mode rejection of parasitic lateral magnetic field components. Thus, the self-test capability enables testing of the interaction between the flux guides of a Z-axis magnetic field sensor and the in-plane magnetoresistive sense elements to allow for a complete evaluation of the Z-axis magnetic field sensor. The coil structure may be post-processed over the top of a magnetic-on-CMOS wafer to cost effectively enable implementation on either existing magnetic field sensor wafers or with new magnetic field sensor designs.

Figure 1:
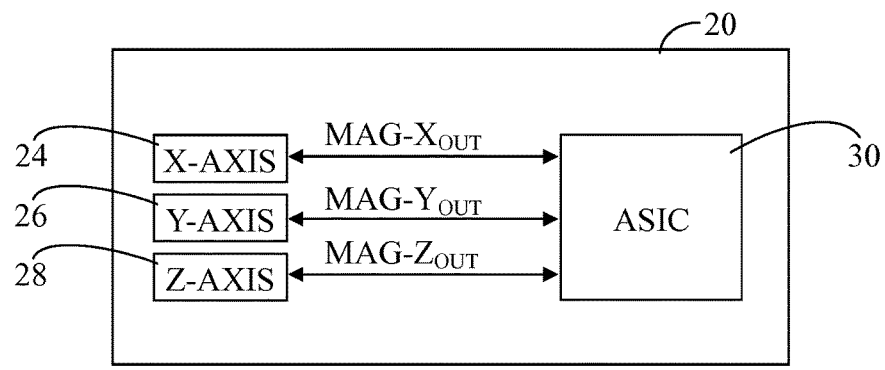
FIG. 1 shows a simplified block diagram of an apparatus that includes a magnetic field sensor.

FIG. 1 shows a simplified block diagram of a sensor package 20. Sensor package 20 may be implemented in any device or system in which magnetic field sensing is required, for example, in compass, security, and military applications, in geophysics and space research applications, in biomagnetism and medical applications, and/or in non-destructive testing. In this example, sensor package 20 may be adapted to sense a magnetic field along three axes. Hence, sensor package 20 includes an X-axis magnetic field sensor 24, a Y-axis magnetic field sensor 26, and a Z-axis magnetic field sensor 28. Magnetic field sensors 24, 26, 28 may be coupled to, or otherwise in communication with, an application specific integrated circuit (ASIC) 30 to form sensor package 20. ASIC 30 performs some or all functions including, but not limited to, signal conditioning and data management, reset and stabilization control, bridge/output multiplexing, self-test, electrostatic discharge (ESD) protection, and so forth.

In an exemplary configuration, magnetic field sensors 24, 26, 28 may be magnetic tunnel junction (MTJ) sensors. An MTJ structure includes a metal-insulator-metal layer sandwich in which the metal layers are ferromagnetic and the insulator layer is very thin. Electrically, this forms a tunnel diode in which electrons can tunnel from one ferromagnet into the other. Such a tunnel diode exhibits transport characteristics that depend, not only on the voltage bias, but also on the magnetic states of the top and bottom electrodes.

At a fixed voltage bias, the resistance of the junction depends upon the alignment of the magnetic moments of the electrodes. In general, when the moments of the two layers are parallel, the resistance of the junction is lowest. When the moments are anti-parallel, the resistance of the junction is highest. And in between, the resistance of the junction varies as the cosine of the angle between moments. In a magnetic field sensor application, the magnetic orientation of one of the ferromagnetic layers is fixed, or "pinned," in a certain direction, while the sense ferromagnetic layer is "free" to follow the orientation of the applied magnetic field which modulates the measured resistance. The MTJ resistors may be assembled into a conventional Wheatstone bridge configuration to form the sensor for sensing an external magnetic field. Sensor package 20 may include three Wheatstone bridge structures (one for each axis).

Figure 2:
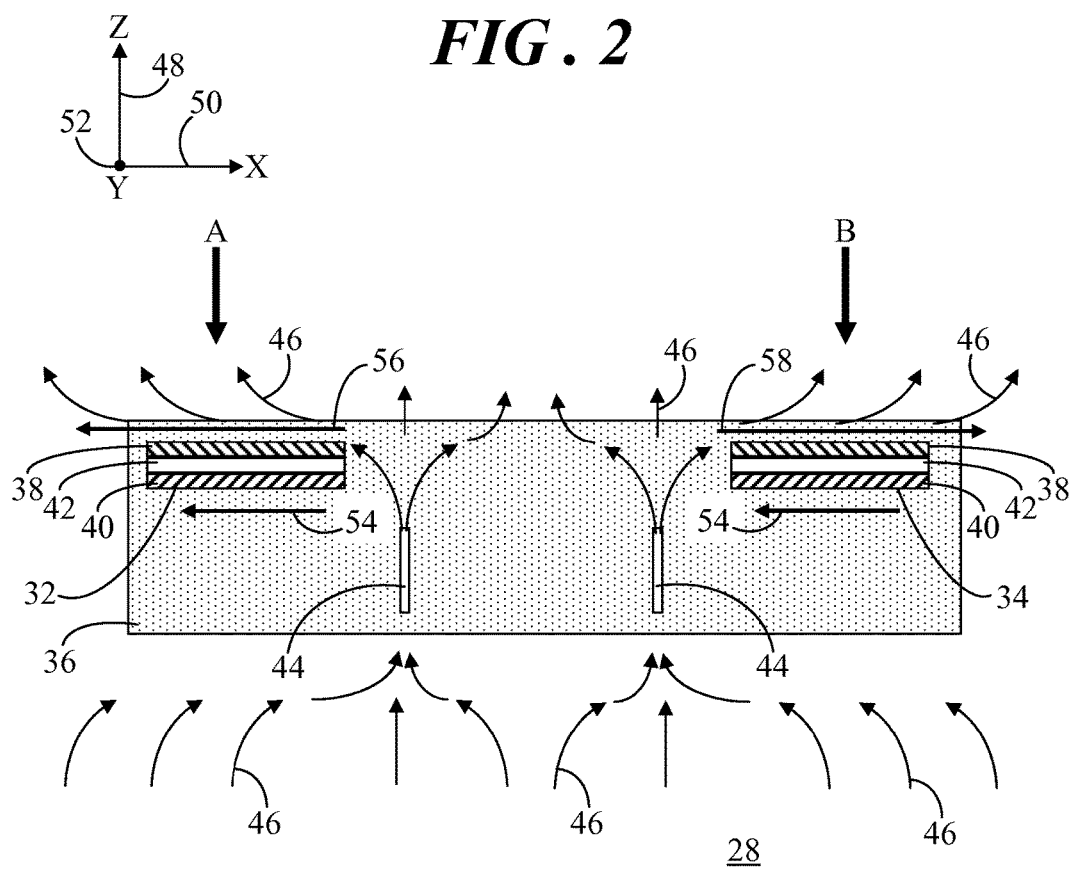
FIG. 2 shows a simplified side view of a Z-axis magnetic field sensor into which embodiments of the present invention may be incorporated.

FIG. 2 shows a simplified side view of Z-axis magnetic field sensor 28 into which embodiments of the present invention may be incorporated. More particularly, FIG. 2 shows Z-axis magnetoresistive sense elements 32, 34 of Z-axis magnetic field sensor 28 formed within a dielectric material 36. Z-axis sense elements 32, 34 are MTJ structures, each of which includes ferromagnetic layers 38, 40 separated by an insulator layer 42. Z-axis magnetic field sensor 28 may include any quantity of Z-axis sense elements 32, 34 in accordance with particular design parameters. Some of the figures are illustrated using various shading and/or hatching to distinguish the different elements produced within the structural layers of Z-axis sense elements 32, 34. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

In order to sense the magnetic field in a direction perpendicular to an X-Y plane of magnetic field sensor 28, flux guides 44 are also formed within dielectric material 36. Flux guides 44 can be used to guide a Z-axis magnetic field 46 (represented by arrows) into the X-Y plane. Flux guides 44 are generally thin, narrow sheets of magnetic material typically used to guide flux, i.e., Z-axis magnetic field 46, to a preferred location. With the use of flux guides 44 incorporated into Z-axis magnetic field sensor 28, Z-axis magnetic field 46 is suitably guided so that it can be sensed by one of the Wheatstone bridge structures (not shown) formed using the in-plane magnetoresistive sense elements (i.e., Z-axis sense elements 32, 34). In this side view illustration, a Z-axis 48 is oriented up-and-down on the page, an X-axis 50 is oriented right-and-left on the page, and a Y-axis 52 is represented as a dot that depicts an axis going either into or out of the page on which FIG. 2 is situated. Accordingly, the X-Y plane in this side view illustration is oriented right-and-left and into or out of the page.

Each of sense elements 32, 34 may include ferromagnetic layer 40 as being fixed, or "pinned," in the same direction, as represented by arrows 54 located below each ferromagnetic layer 40 in FIG. 2. Therefore, ferromagnetic layer 40 is referred to hereinafter as pinned layer 40. Ferromagnetic layer 38 for each of sense elements 32, 34 is "free" to respond to the applied magnetic field which modulates the measured resistance. Accordingly, ferromagnetic layer 38 is referred to hereinafter as free layer 38.

In the illustrative configuration of FIG. 2, Z-axis magnetoresistive sense elements 32 and 34 are referred to using different reference numbers in order to distinguish them as being different "types" of sense elements. More particularly, flux guides 44 are suitably positioned so that Z-axis sense element 32 has a different flux guide/sense element orientation than Z-axis sense element 34. As exemplified, one of flux guides 44 is located proximate a right edge of sense element 32. In this exemplary configuration, at a fixed voltage bias, Z-axis magnetic field 46 will be guided into the X-Y plane for detection at sense element 32 such that the magnetic moment of free layer 38 is oriented in a direction that is more parallel with the magnetic moment of fixed layer 40. Consequently, this particular flux guide/sense element orientation is configured to guide Z-axis magnetic field 46 into the X-Y plane in a first direction, represented by an arrow 56, for detection at sense element 32.

Conversely, one of flux guides 44 is located proximate a left edge of sense element 34. In this exemplary configuration, at a fixed voltage bias, Z-axis magnetic field 46 will be guided into the X-Y plane for detection at sense element 34 such that the magnetic moment of free layer 38 is directed away from, i.e., anti-parallel with, the magnetic moment of fixed layer 40. Consequently, this particular flux guide/sense element orientation is configured to guide Z-axis magnetic field 46 into the X-Y plane in a second direction, represented by an arrow 58, for detection at sense element 34. As shown in FIG. 2, both of first and second directions 56, 58 of guidance of Z-axis magnetic field are generally parallel to X-axis 58. However, second direction 58 is opposite first direction 56. The opposing sense directions 56, 58 enables a differential sensing mode which can be implemented in a Wheatstone bridge configuration.

For clarity, the magnetoresistive sense elements (for example, sense element 32) having a flux guide/sense element orientation that results in parallel sensing capability may be referred to herein as "Type A" sense elements, labeled "A" in FIG. 2. The magnetoresistive sense elements (for example, sense element 34) having a flux guide/sense element orientation that results in anti-parallel sense capability may be referred to herein as "Type B" sense elements, labeled "B" in FIG. 2. FIG. 2 shows a single Type A in-plane sense element 32 and a single Type B in-plane sense element 34 for simplicity of illustration. However, a Z-axis magnetic field sensor configuration can have any quantity of Type A sense elements 32 and Type B sense elements 34 in accordance with particular design parameters.

What is absent in prior art Z-axis magnetic field sensors, such as magnetic field sensor 28, is the ability to perform a true self-test of the Z-axis magnetic field sensors. That is, currently implemented Z-axis self test stimulates only in-plane sense elements 32, 34 and thus excludes the functionality of flux guides 44. Embodiments discussed herein employ a self-test capability that includes the interaction between flux guides 44 and in-plane sense elements 32, 34 in order to check for sensor functionality and/or for sensitivity calibration.

Figure 3:
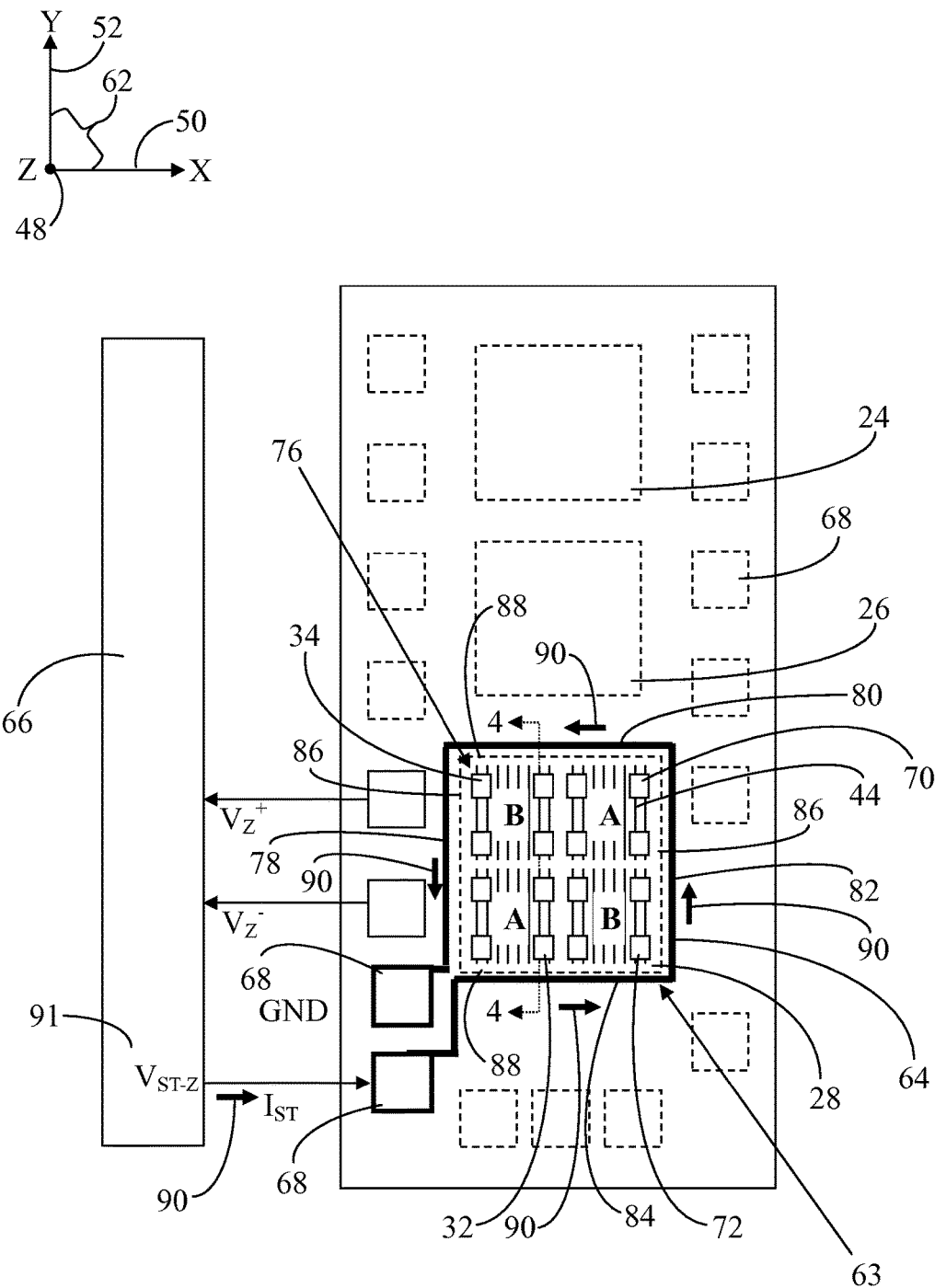
FIG. 3 shows a top schematic view of a sensor package having self-test capability in accordance with an embodiment.
Figure 4:
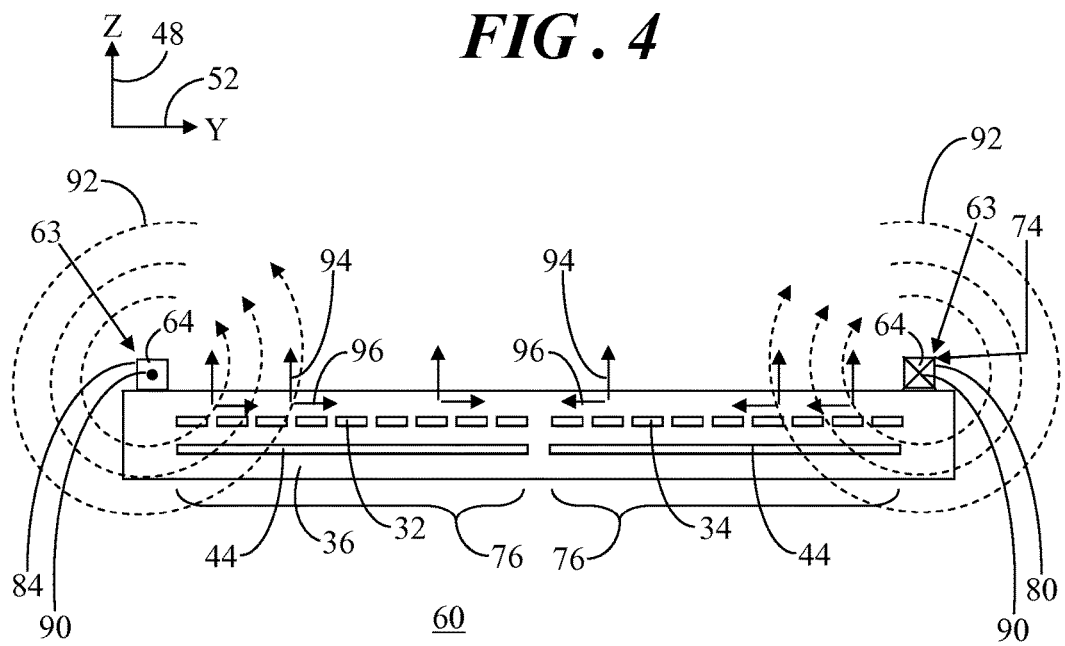
FIG. 4 shows a partial side view of the sensor package along section lines 4-4 of FIG. 3.

Referring to FIGS. 3-4, FIG. 3 shows a top schematic view of a sensor package 60 having self-test capability in accordance with an embodiment and FIG. 4 shows a partial side view of sensor package 60 along section lines 4-4 of FIG. 3. Sensor package 60 includes Z-axis magnetic field sensor 28 (shown in dashed line form in FIG. 3). Sensor package 60 may additionally include X-axis magnetic field sensor 24 and/or Y-axis magnetic field sensor 26 (also shown in dashed line form in FIG. 3). As discussed previously, in order to sense Z-axis magnetic field 46 (FIG. 2) oriented perpendicular to an X-Y plane 62 of sensor package 60, Z-axis magnetic field sensor 28 includes flux guides 44 configured to direct Z-axis magnetic field 46 (FIG. 2) into X-Y plane 62. In the top view illustration of FIG. 3, X-Y plane 62 is oriented up-and-down and right-and-left on the page on which FIG. 3 is situated.

In accordance with an embodiment, sensor package 60 further includes a current carrying structure 63 in the form of a coil structure 64 positioned proximate Z-axis magnetic field sensor 28. Circuitry 66 in the form of an application specific integrated circuit (ASIC), is coupled to coil structure 64. In some embodiments, circuitry 66 may be a CMOS (complementary metal-oxide-semiconductor) integrated circuit with sensor package 60 formed thereon or otherwise attached thereto to yield a sensor package on CMOS wafer structure. Sensor package 60 may further include a plurality of bond pads 68 that may be utilized to electrically interconnect sensor package 60 with circuitry 66, to ground, and/or with external devices (not shown) in accordance with a particular package design.

In an embodiment, Z-axis magnetic sensor 28 includes a first plurality of Type A in-plane magnetoresistive sense elements 32, a second plurality of Type B in-plane magnetoresistive sense elements 34, a third plurality of Type A in-plane magnetoresistive sense elements 70, and a fourth plurality of Type B in-plane magnetoresistive sense elements 72. As shown in FIG. 3, the arrays of sense elements 32, 34, 70, and 72 are segregated into four quadrants, and the four quadrants are surrounded by coil structure 64. Sense elements 70 have a flux guide/sense element orientation similar to that of sense elements 32. Likewise, sense elements 72 have a flux guide/sense element orientation similar to that of sense elements 34. Thus, in FIG. 3, the letter "A" overlies the two quadrants containing sense elements 32 and 70, and the letter "B" overlies the two quadrants containing sense elements 34 and 72.

Only four sense elements 32, 34, 70, or 72 are shown in each array of sense elements for clarity. Those skilled in the art readily recognize that each quadrant may have more or less than four of its associated sense elements 32, 34, 70, 72. Additionally, the terms "first," "second," "third," and "fourth" utilized herein do not refer to an order or prioritization of components. Instead, the terms are used to distinguish certain elements and/or to provide correspondence with terminology utilized in the claims.

For purposes of illustration flux guides 44 are shown in FIG. 3 to demonstrate their location within the four quadrants of Z-axis magnetic sensor 28 and to demonstrate their orientation parallel to Y-axis 52. Additionally, flux guides 44 are shown in FIG. 3 to demonstrate their position relative to sense elements 32, 34, 70, 72. Sensor package 60 may include more than or less than the quantity of flux guides 44 shown in FIGS. 3 and 4.

In an embodiment, coil structure 64 is formed in at least one structural layer 74 that is vertically displaced (as shown in FIG. 4) away from in-plane sense elements 32, 34, 70, 72. Additionally, coil structure 64 is laterally displaced away from an area 76 of said sensor package 60 at which in-plane sense elements 32, 34, 70, 72 are located (as shown in both FIGS. 3 and 4). Coil structure 64 includes a first segment 78, a second segment 80 coupled with first segment 78, a third segment 82 coupled with second segment 80, and a fourth segment 84 coupled with third segment 82. In the illustrative embodiment, first and third segments 78 and 82 are located at opposing edges 86 of area 76. Similarly, second and fourth segments 80 and 84 are located at opposing edges 88 of area 76. Thus, in-plane sense elements 32, 34 are positioned proximate first segment 78 and in-plane sense elements 70, 72 are positioned proximate third segment 82. Although coil structure 64 is formed as a single coil or loop of conductive material surrounding area 76, it should be understood that coil structure 64 may include multiple interconnected coils surrounding area 76 at which in-plane sense elements 32, 34, 70, 72 are located.

With continued reference to FIGS. 3 and 4, circuitry 66 is configured to provide self-test current 90, $I_{ST}$, having a predetermined self-test voltage 91, $V_{ST}$, to coil structure 64, via an attached one of bond pads 68. With particular reference to FIG. 4, current 90 generates a self-test magnetic field 92 about coil structure 64 to be sensed by in-plane sense elements 32, 34. Although not visible in FIG. 4, self-test magnetic field 92 may also be sensed by in-plane sense elements 70, 72 (see FIG. 3). Of course, circuitry 66 may additionally perform some or all functions including, but not limited to, signal conditioning and data management, reset and stabilization control, bridge/output multiplexing, self-test, electrostatic discharge (ESD) protection, and so forth.

In FIG. 4, self-test current 90 is represented as a dot in segment 84 of coil structure 64 to indicate its flow outwardly from the page upon which FIG. 4 is drawn. Additionally, self-test current is represented as an "X" in segment 80 of coil structure 64 to indicate its flow inwardly into the page upon which FIG. 4 is drawn. Since coil structure 64 is not co-planar with in-plane sense elements 32, 34, 70, 72, both vertical (e.g., Z-axis) vector components 94 and lateral (e.g., X-axis and Y-axis) vector components 96 of self-test magnetic field 92 are generated by the flow of self-test current 90 through coil structure 64.

Figure 5:
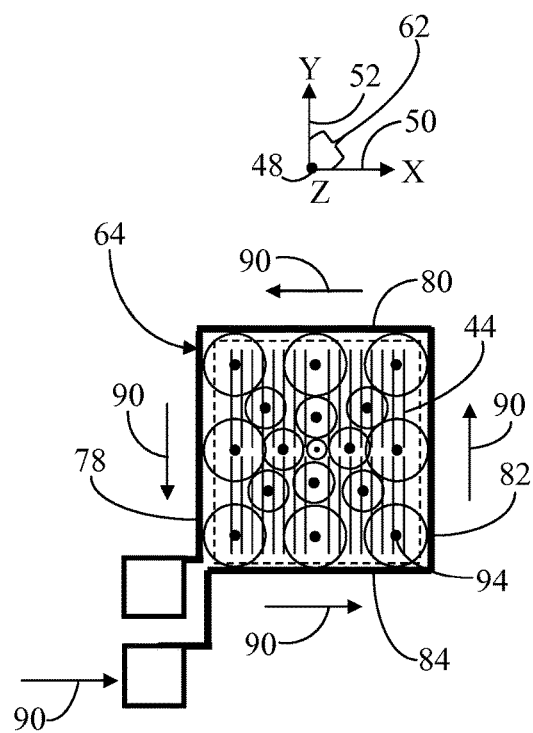
FIG. 5 shows a partial top schematic view of a current carrying structure producing a Z-axis vector component of a self-test magnetic field.

FIG. 5 shows a partial top schematic view of coil structure 64 producing vertical vector components 94 of self-test magnetic field 92. Vertical vector components 94 of self-test magnetic field 92 are represented by a dot surrounded by a circle to indicate that vertical vector components 94 extend outwardly from the page upon which FIG. 5 is drawn. Accordingly, vertical vector components 94 extend substantially parallel to Z-axis 48 and are therefore oriented substantially perpendicular to X-Y plane 62. For clarity, vertical vector components 94 are referred to hereinafter as Z-axis vector components 94. It should be observed that the size of the circles representing Z-axis vector components 94 vary as a function of their distance from coil structure 64. This represents the non-uniformity in Z-axis vector components 94 of self-test magnetic field 92 across the array of in-plane sense elements 32, 34, 70, 72 relative to their distance from coil structure 64. Z-axis vector components 94 can be advantageously exploited to provide a self-test capability that includes the interaction between flux guides 44 and in-plane sense elements 32, 34, 70, 72 in order to check for sensor functionality and/or for sensitivity calibration.

Figure 6:
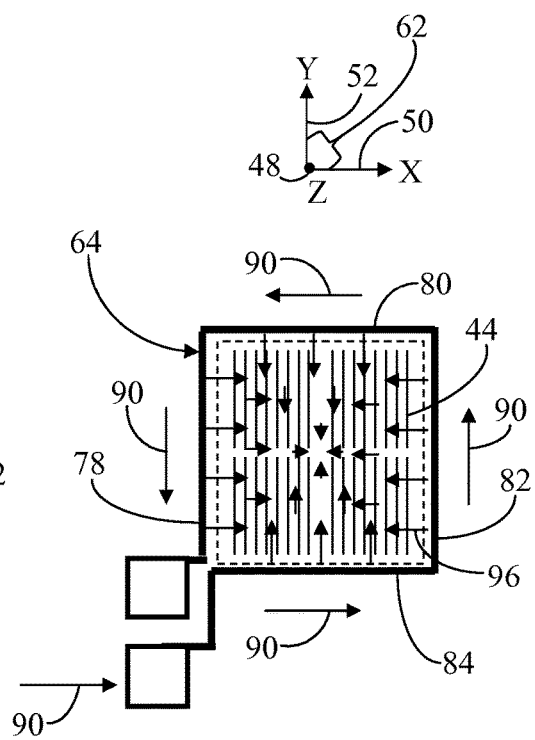
FIG. 6 shows a partial top schematic view of a current carrying structure producing a lateral vector component of the self-test magnetic field.

FIG. 6 shows a partial top schematic view of coil structure 64 producing lateral vector components 96 of self-test magnetic field 92. Lateral vector components 96 of self-test magnetic field 92 are represented by straight arrows extends rightwardly, leftwardly, upwardly, and downward in the page upon which FIG. 6 is drawn. Accordingly, lateral vector components 96 are substantially parallel to X-Y plane 62. It should be observed that the length of the arrows representing lateral vector components 96 vary as a function of their distance from coil structure 64. This represents the non-uniformity in lateral vector components 96 of self-test magnetic field 92 across the array of in-plane sense elements 32, 34, 70, 72 relative to their distance from coil structure 64. Lateral vector components 96 are parasitic lateral magnetic field components because this lateral magnetic field does not involve the function of flux guides 44. As discussed below, the parasitic lateral magnetic field components can be suitably canceled to enable use of Z-axis vector components 94 (FIG. 5) to provide full self-test capability that includes the interaction between flux guides 44 and in-plane sense elements 32, 34, 70, 72.

Figure 7:
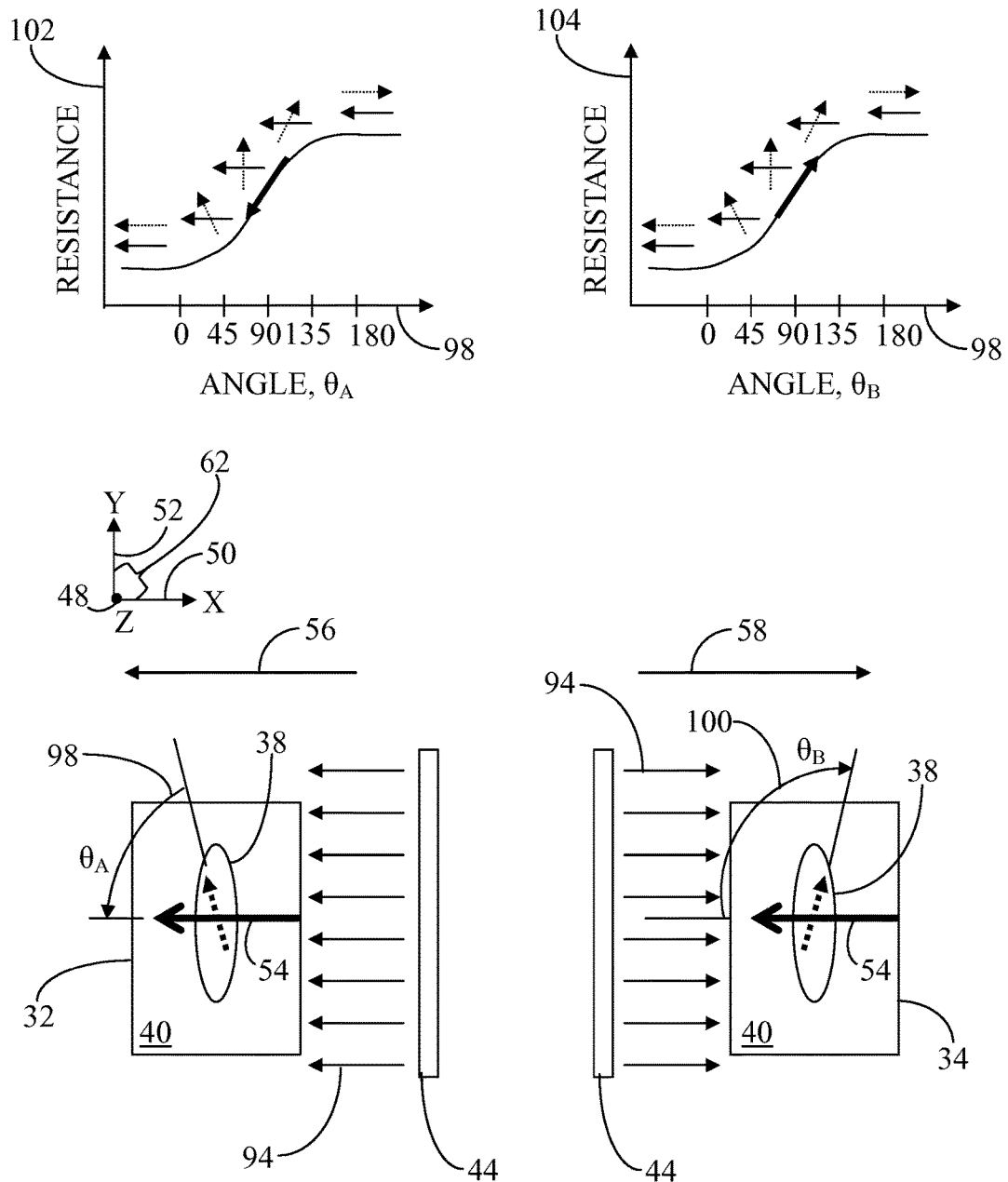
FIG. 7 shows a schematic view of a response of the magnetic field sensor to the Z-axis vector component of a self-test magnetic field.

FIG. 7 shows a partial schematic view of a response of magnetic field sensor 60 to Z-axis vector components 94 of self-test magnetic field 92 (FIG. 4). Magnetic field sensor 60 is represented by a top view of two magnetoresistive sense elements. These sense elements can be either of Type A magnetoresistive sense elements 32, 70 and Type B magnetoresistive sense elements 34, 72. For simplicity, Type A magnetoresistive sense element 32 and Type B magnetoresistive sense element 34 are shown. However, the ensuing discussion applies equivalently to Type A magnetoresistive sense element 70 and Type B magnetoresistive sense element 72 (FIG. 3).

In order to sense Z-axis vector components 94 flux guides 44 guide Z-axis vector components 94 into the X-Y plane 62. Each of sense elements 32, 34, 70, 72 include pinned layer 40 that is pinned in the same direction, as represented by arrows 54. Free layer 38 follows the orientation of Z-axis vector components 94. For magnetoresistive sense element 32, Z-axis vector components 94 are guided into X-Y plane 62 in first direction 56 due to the particular locations of their corresponding flux guides 44. Conversely, for magnetoresistive sense element 34, Z-axis vector components 94 are guided into X-Y plane 62 in the opposing second direction 58 due to the particular locations of their corresponding flux guides 44. An angle 98, $\theta_A$, represents the magnetization or polarization of free layer 38 relative to pinned layer 40 for Type A magnetoresistive sense element 32. An angle 100, $\theta_B$, represents the magnetization or polarization of free layer 38 relative to pinned layer 40 for Type B magnetoresistive sense element 34.

The magnetization 98, $\theta_A$, and a corresponding resistance 102 of magnetoresistive sense element 32 depend upon the alignment of the magnetic moments of the free layer 38 versus pinned layer 40. Likewise, the magnetization 100, $\theta_B$, and a corresponding resistance 104 of magnetoresistive sense element 34 depends upon the alignment of the magnetic moments of the free layer 38 versus pinned layer 40. Due to the guidance of Z-axis vector components 94 via flux guides 44 in first direction 56, magnetization 98, $\theta_A$, of Type A magnetoresistive sense element 32 decreases while magnetization 100, $\theta_B$, of Type B magnetoresistive sense element 34 concurrently increases. Accordingly, resistance 102 of Type A magnetoresistive sense element 32 decreases and resistance 104 of Type B magnetoresistive sense element 34 increases in response to the presence of Z-axis vector components 94. This response to Z-axis vector components 94 creates a differential sense mode for sensing Z-axis vector components 94.

Figure 8:
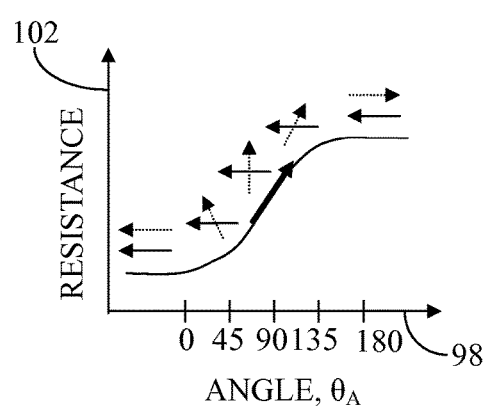
FIG. 8 shows a schematic view of a response of the magnetic field sensor to the lateral vector component of a self-test magnetic field.
Figure 8:
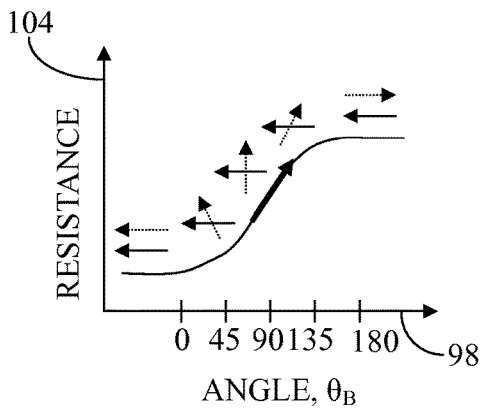
Figure 8:
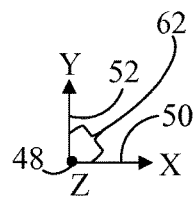
Figure 8:
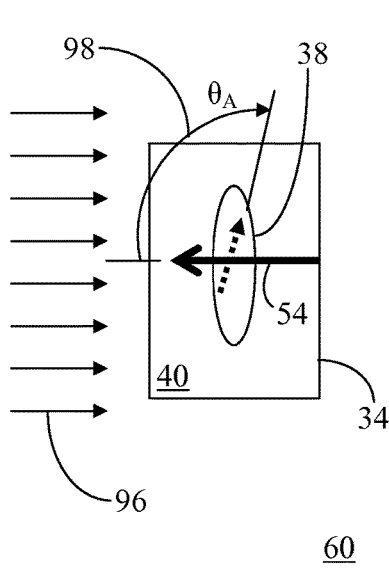
Figure 8:
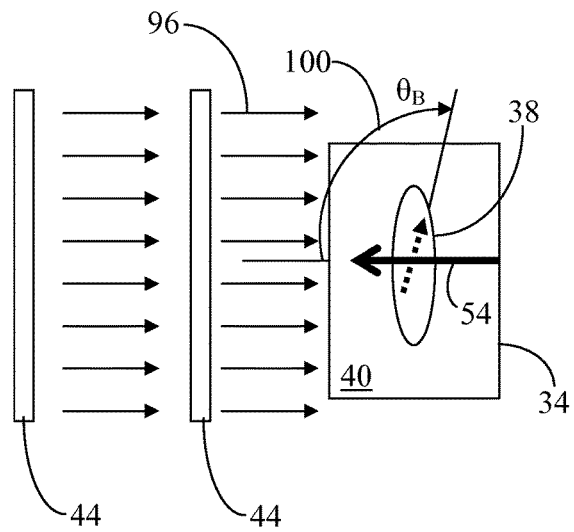

FIG. 8 shows a schematic view of a response of magnetic field sensor 60 to lateral vector components 96 of self-test magnetic field 92 (FIG. 4). Again, magnetic field sensor 60 is represented by a top view of two magnetoresistive sense elements. These sense elements can be either of Type A magnetoresistive sense elements 32, 70 and Type B magnetoresistive sense elements 34, 72. Again, only Type A magnetoresistive sense element 32 and Type B magnetoresistive sense element 34 are shown. However, the ensuing discussion applies equivalently to Type A magnetoresistive sense element 70 and Type B magnetoresistive sense element 72 (FIG. 3).

It should be understood that lateral (X-axis and Y-axis) vector components 96 are not guided into X-Y plane 62 by flux guides 44 because lateral vector components 96 are already aligned with X-Y plane 62. Again, angle 98, $\theta_A$, represents the magnetization or polarization of free layer 38 relative to pinned layer 40 for Type A magnetoresistive sense element 32 and an angle 100, $\theta_B$, represents the magnetization or polarization of free layer 38 relative to pinned layer 40 for Type B magnetoresistive sense element 34.

Lateral vector components 96 parallel to Y-axis 52 in this example are considered a cross-axis response. However, a cross-axis Y-field does not yield a Z-axis response, rather a cross-axis Y-field may only modulate the sensitivity of in-plane sense elements 32, 34 at a very low rate of, for example, 0.1%.

Lateral vector components 96 parallel to X-axis 50 in this configuration are also considered a cross-axis response. However, lateral vector components 96 parallel to X-axis 50 can be on the order of five times stronger than the on-axis, or Z-axis, response represented by Z-axis vector components 94 (FIG. 7). Thus, lateral vector components 96 parallel to X-axis 50 are considered a parasitic magnetic field. The greater strength of lateral vector components 96 is due to the coupling inefficiency of flux guides 44 (i.e., the ability of flux guides 44 to effectively guide all of vertical vector components 94 of self-test magnetic field 92 into X-Y plane 62). Accordingly, in order to provide self-test capability that includes the interaction of flux guides 44 with in-plane sense elements 32, 34, 70, 72 it is necessary to cancel or otherwise remove the cross-axis X-field (i.e., lateral vector components 96 parallel to X-axis 50).

As shown in FIG. 8, in the presence of lateral vector components 96 parallel to X-axis 50 as magnetizations 98, $\theta_A$, and 100, $\theta_B$, increase, the corresponding resistances 102 and 104 will also increase. Thus, when in-plane sense elements 32, 34, 70, 72 are suitably connected in a Wheatstone bridge configuration, resistances 102 and 104 will cancel, and thereby nullify the effect of the parasitic X-axis lateral vector components 96.

Figure 9:
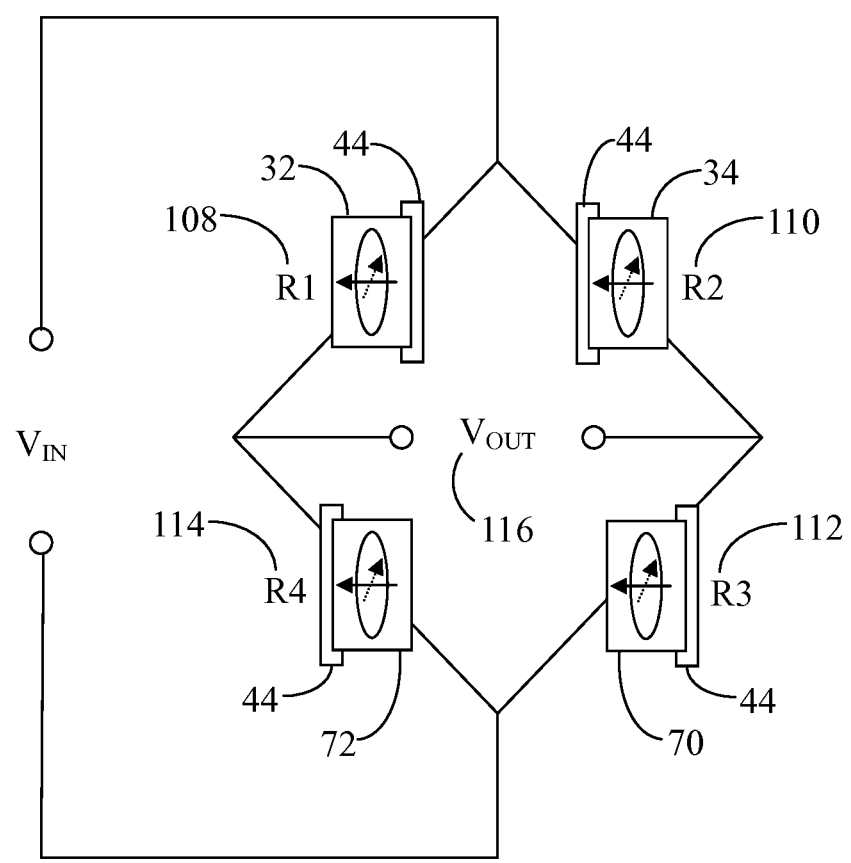
FIG. 9 shows a schematic diagram of a Wheatstone bridge configuration of magnetoresistive sense elements of the Z-axis magnetic field sensor in accordance with an embodiment.

FIG. 9 shows a schematic diagram of a Wheatstone bridge configuration 106 of magnetoresistive sense elements 32, 34, 70, 72 of Z-axis magnetic field sensor 60 (FIG. 3) in accordance with an embodiment. More particularly, Type A magnetoresistive sense elements 32, 70 and Type B magnetoresistive sense elements 34, 72 are connected in Wheatstone bridge configuration 106. In the exemplary Wheatstone bridge configuration 106 illustrated in FIG. 9, Type A magnetoresistive sense element 32 and Type B magnetoresistive sense element 34 are connected in parallel. Additionally, Type A magnetoresistive sense element 32 and Type B magnetoresistive sense element 72 are connected in series, and Type B magnetoresistive sense element 34 and Type A magnetoresistive sense element 70 are connected in series.

For illustrative purposes, resistances are provided in association with magnetoresistive sense elements 32, 34, 70, 72 shown in FIG. 9. In this example, a resistance 108, R1, represents the signal output of Type A magnetoresistive sense element 32. A resistance 110, R2, represents the signal output of Type B magnetoresistive sense element 34. A resistance 112, R3, represents the signal output of Type A magnetoresistive sense element 70. And, a resistance 114, R4, represents the signal output of Type B magnetoresistive sense element 72.

The differential response of Wheatstone bridge configuration 106 can be described as follows:

$$\Delta V_{OUT} = \frac{(\Delta R_1 - \Delta R_2 + \Delta R_3 - \Delta R_4)}{4R} V_{IN} \quad (1)$$

In this exemplary situation in which coil 64 is not coplanar with in-plane sense elements 32, 34, 70, 42, the applied self-test magnetic field 92 (FIG. 4) applied to Type A sense elements 32, 70 and type B sense elements 34, 72 includes Z-axis vector components 94 and lateral X-axis vector components 96 (see FIG. 4). As such, resistances 108, 110, 112, and 114 can be defined as follows:

$$\Delta R_1 = \Delta R_{Z1} + \Delta R_{X1} \quad (2)$$

$$\Delta R_2 = \Delta R_{Z2} + \Delta R_{X2} \quad (3)$$

$$\Delta R_3 = \Delta R_{Z3} + \Delta R_{X3} \quad (4)$$

$$\Delta R_4 = \Delta R_{Z4} + \Delta R_{X4} \quad (5)$$

where $\Delta R_{Zn}$ represents the change in resistance due to Z-axis vector components 94 and $\Delta R_{Xn}$ represents the change in resistance due to X-axis vector components 96. Accordingly, when self-test magnetic field 92 is applied, the differential response of Wheatstone bridge configuration 106 represented by equation (1) can be described as follows:

$$\Delta V_{OUT} = \frac{((\Delta R_{Z1} + \Delta R_{X1}) - (\Delta R_{Z2} + \Delta R_{X2}) + (\Delta R_{Z3} + \Delta R_{X3}) - (\Delta R_{Z4} + \Delta R_{X4}))}{4R} V_{IN} \quad (6)$$

In the configuration in which Type A sense element 32 and Type B sense element 34 are proximate first segment 78 (see FIG. 3) of coil 64 and Type A sense element 70 and Type B sense element 72 are proximate third segment 86 (see FIG. 3) of coil 64, then the following holds true:

$$\Delta R_{X1} = \Delta R_{X2} = +\Delta R_{ST1} \quad (7)$$

$$\Delta R_{X2} = \Delta R_{X4} = -\Delta R_{ST2} \quad (8)$$

Substituting equations (7) and (8) into equation (6) and rearranging terms yields the following:

$$\Delta V_{OUT} = \frac{(\Delta R_{Z1} - \Delta R_{Z2} + \Delta R_{Z3} - \Delta R_{Z4} + \Delta R_{ST1} - \Delta R_{ST1} + (-\Delta R_{ST2}) - (-\Delta R_{ST2}))}{4R} V_{IN} \quad (9)$$

Simplifying equation (9) yields the following:

$$\Delta V_{OUT} = \frac{(\Delta R_{Z1} - \Delta R_{Z2} + \Delta R_{Z3} - \Delta R_{Z4})}{4R} V_{IN} \quad (10)$$

Accordingly, the structural configuration of Type A in-plane sense elements 32, 70 and Type B in-plane sense element 34, 72 relative to coil 64 produces a canceling Wheatstone bridge response which cancels X-axis lateral vector components 96 from the solution. As such, a voltage signal output 116 from Wheatstone bridge configuration 106 is based upon Z-axis vector components 94 which can therefore be used in a self-test capacity to test the interaction between flux guides 44 of a Z-axis magnetic field sensor 60 and in-plane magnetoresistive sense elements 32, 34, 70, 72.

Figure 10:
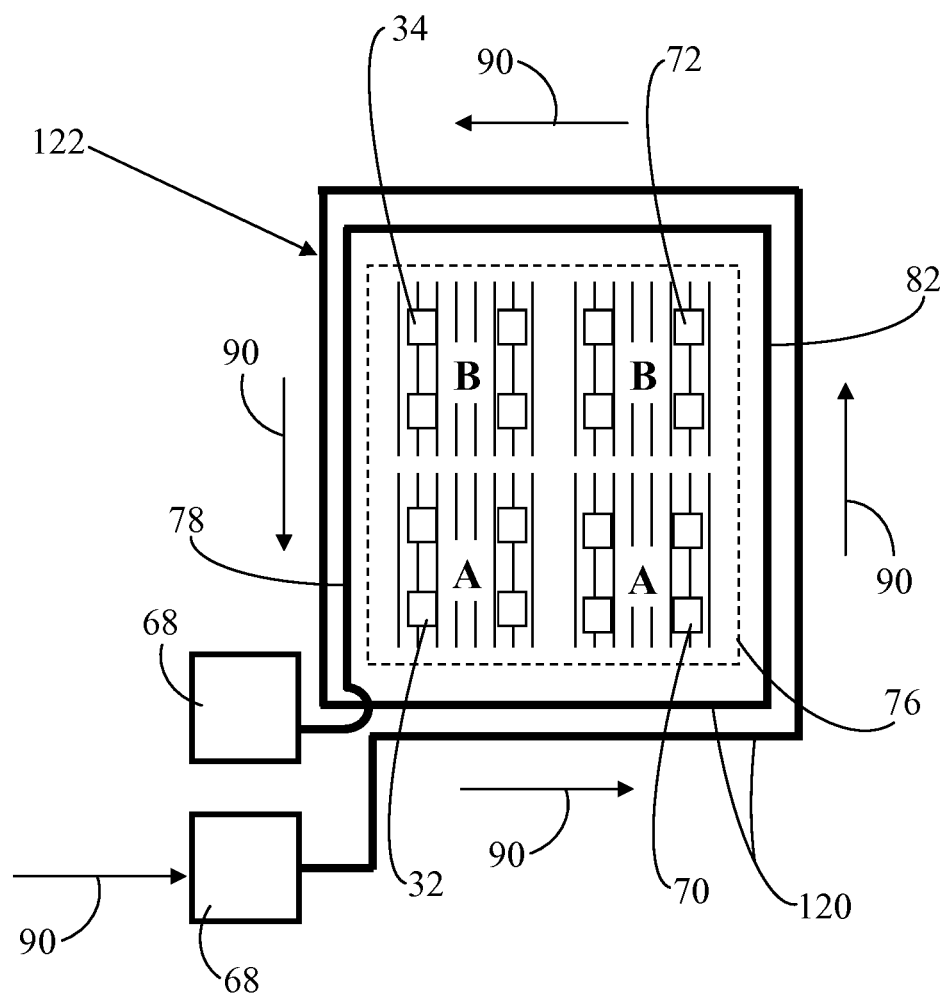
FIG. 10 shows a partial top schematic view of the placement of a coil structure and an alternative placement of in-plane sense elements in accordance with another embodiment.

FIG. 10 shows a partial top schematic view of a current carrying structure 118 and an alternative placement of in-plane sense elements 32, 34, 70, 72 in accordance with another embodiment. As shown, current carrying structure 118 may include multiple serially connected coils 120 that form a continuous coil 122 surrounding area 76 occupied by in-plane sense elements 32, 34, 70, 72. The illustrated configuration includes two coils 120. However, alternative embodiments may include more than two coils 120. The use of multiple coils 120 enables the use of a lower self-test current 90 than what might otherwise be required with a single coil current carrying structure.

Referring now to the placement of in-plane sense elements 32, 34, 70, 72, in the illustrated embodiment, Type A in-plane element 32 and Type B in-plane element 34 remain in their original locations within area 76 as described in connection with FIG. 3. However, in-plane sense elements 70, 72 have switched positions. Such a configuration would still enable cancellation, or removal, of X-axis lateral vector component 96 (FIG. 4) of self-test magnetic field 92 (FIG. 4).

Those skilled in the art will readily recognize that alternative embodiments may include a single coil structure with the placement of in-plane sense elements 32, 34, 70, 72 shown in FIG. 10. Still other embodiments may include a multiple coil structure with the placement of in-plane sense elements 32, 34, 70, 72 arranged as shown in FIG. 3. A non-allowable arrangement of in-plane sense elements 32, 34, 70, 72 could be to place Type A sense elements 32, 70 proximate first segment 78 of the innermost coil 120 and to place Type B sense elements 34, 72 proximate third segment 82 of the innermost coil 120. This non-allowable arrangement would not provide cancellation of X-axis lateral vector component 96.

Figure 11:
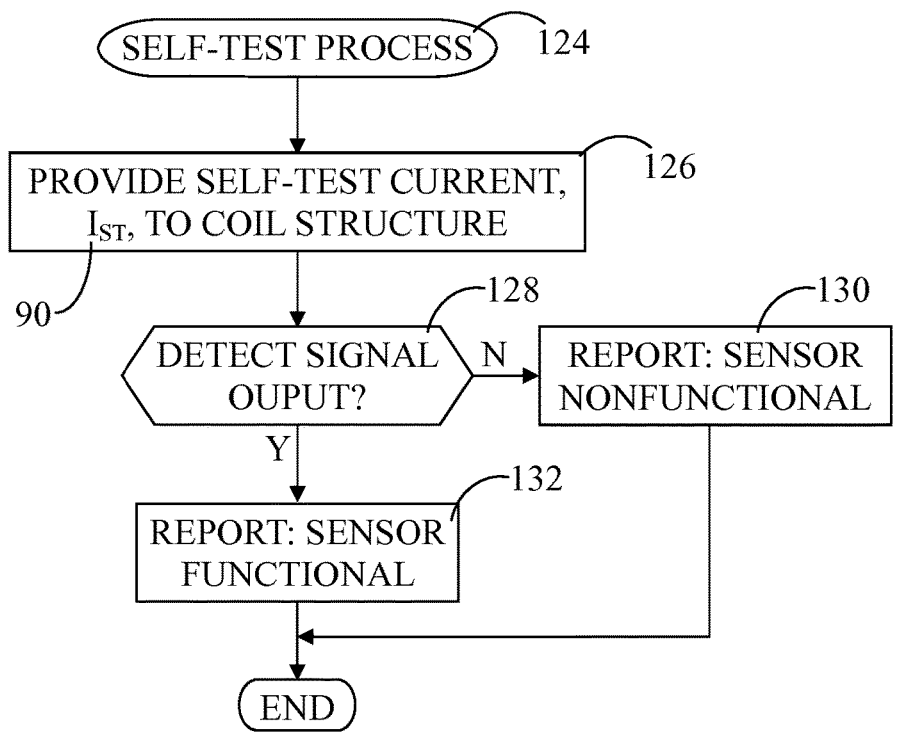
FIG. 11 shows a flowchart of a self-test process utilizing the current carrying structure in accordance with yet another embodiment.

FIG. 11 shows a flowchart of a self-test process 124 utilizing one of the current carrying structures described above in accordance with yet another embodiment. For clarity, self-test process 124 will be described in connection with the configuration of FIG. 3 showing sensor package 60 having current carrying structure 63 with coil structure 64. Therefore, FIG. 3 should be referred to in connection with the ensuing methodology. In accordance with self-test process 124, the self-test capability of sensor package 60 may be employed in order to check for sensor functionality.

Execution of self-test process 124 entails providing self-test current 90 to coil structure 64 (126), and monitoring for signal output 116 from Wheatstone bridge configuration 106 (see FIG. 9). When a suitable signal output 116 is not detected (128), Z-axis magnetic field sensor 28 of sensor 60 may be reported as being non-functional (130) after which the application of self-test current 90 may be discontinued and self-test process 124 ends. Alternatively, when a suitable signal output 116 is detected (128), Z-axis magnetic field sensor 28 of sensor package 60 may simply be reported as being functional (132) after which the application of self-test current 90 may be discontinued and self-test process 124 ends. In such a manner, self-test process 124 may be implemented post processing or in the field to determine the functionality of Z-axis magnetic field sensor 28.

Figure 12:
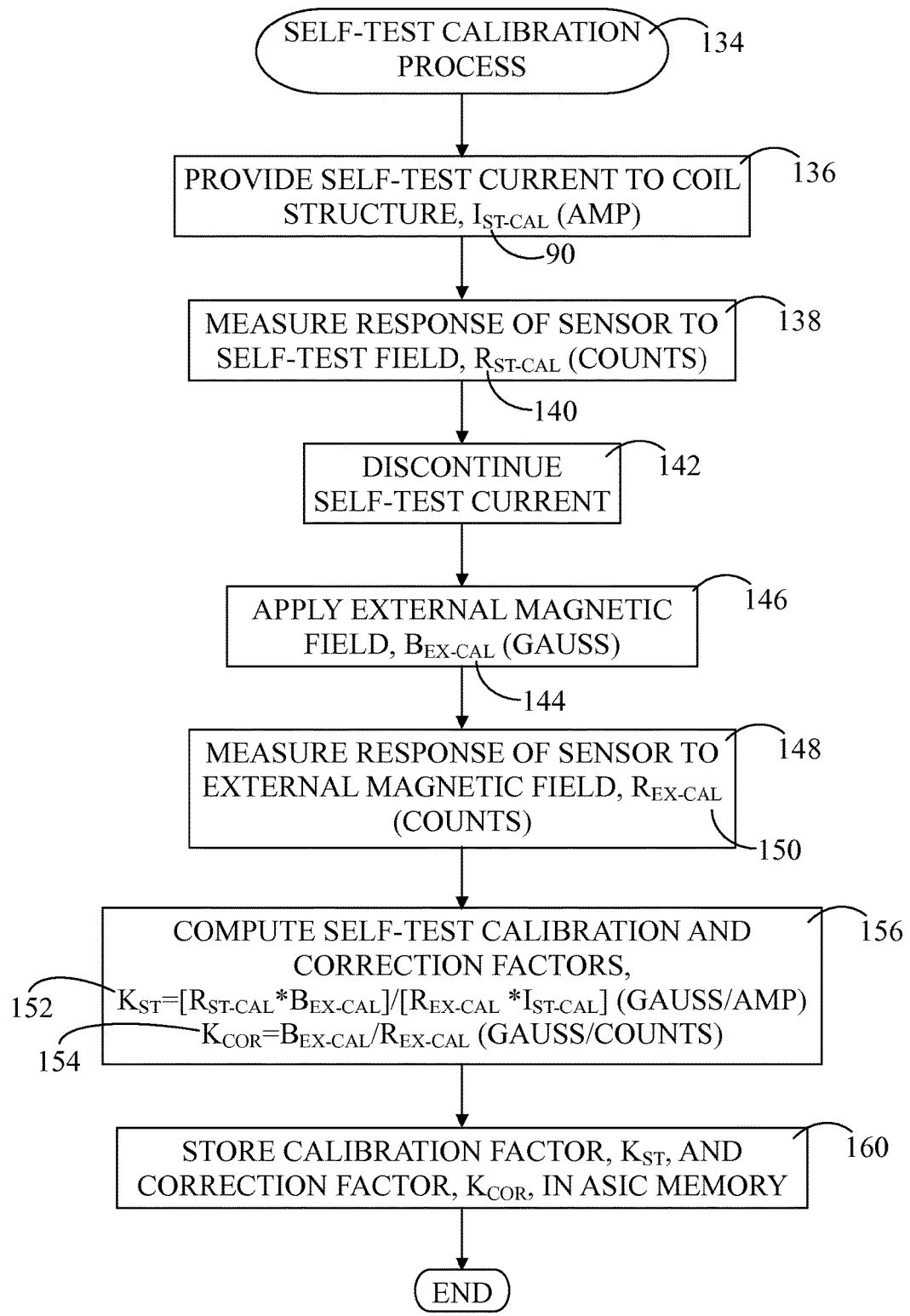
FIG. 12 shows a flowchart of a self-test calibration process utilizing the current carrying structure in accordance with yet another embodiment.

FIG. 12 shows a flowchart of a self-test calibration process 134 utilizing one of the current carrying structures described above in accordance with yet another embodiment. Self-test calibration process 134 will be described in connection with the configuration of FIG. 3 showing sensor package 60 having current carrying structure 63 with coil structure 64. Therefore, FIG. 3 should be referred to in connection with the ensuing methodology. In accordance with self-test calibration process 134, the self-test capability of sensor package 60 may be employed to calibrate sensor package 60 during final test or post processing activities associated with sensor package 60.

Execution of self-test calibration process 134 entails providing self-test current 90 as a calibration current, $I_{ST-CAL}$, to coil structure 64 (136), and measuring signal output 116 from Wheatstone bridge configuration 106 (see FIG. 9) (138). In this example, output signal 116 is represented at 138 by a response, $R_{ST-CAL}$, 140 (in counts) to self-test magnetic field 92 (FIG. 4) resulting from self-test current 90. After response, $R_{ST-CAL}$, 140, is measured, the provision of self-test current 90 may be discontinued (142). An external magnetic field, $B_{EX-CAL}$, 144 may be applied (146) to Z-axis magnetic field sensor 28 (146) and signal output 116 from Wheatstone bridge configuration 106 is detected in response to the applied calibrated external magnetic field, $B_{EX-CAL}$, 144 (148). In this example, output signal 116 is represented at 148 by a response, $R_{EX-CAL}$, 150 (in counts) to external magnetic field 144.

A calibration factor 152, $K_{ST}$, and/or a correction factor 154, $K_{COR}$, may be computed in accordance with known methodologies (156). Calibration factor 152 and/or correction factor 154 may then be applied to Z-axis magnetic field sensor 28 (146) by, for example, storing calibration factor 152 and/or correction factor 154 in memory associated with ASIC 66 in connection with signal processing functions for Z-axis magnetic field sensor 128 (160) after which self-test calibration process 134 ends. In such a manner, self-test calibration process 134 may be implemented during final test in order to calibrate Z-axis magnetic field sensor 28 taking into account the interaction of flux guides 44 and in-plane sense elements 32, 34, 70, 72.

Figure 13:
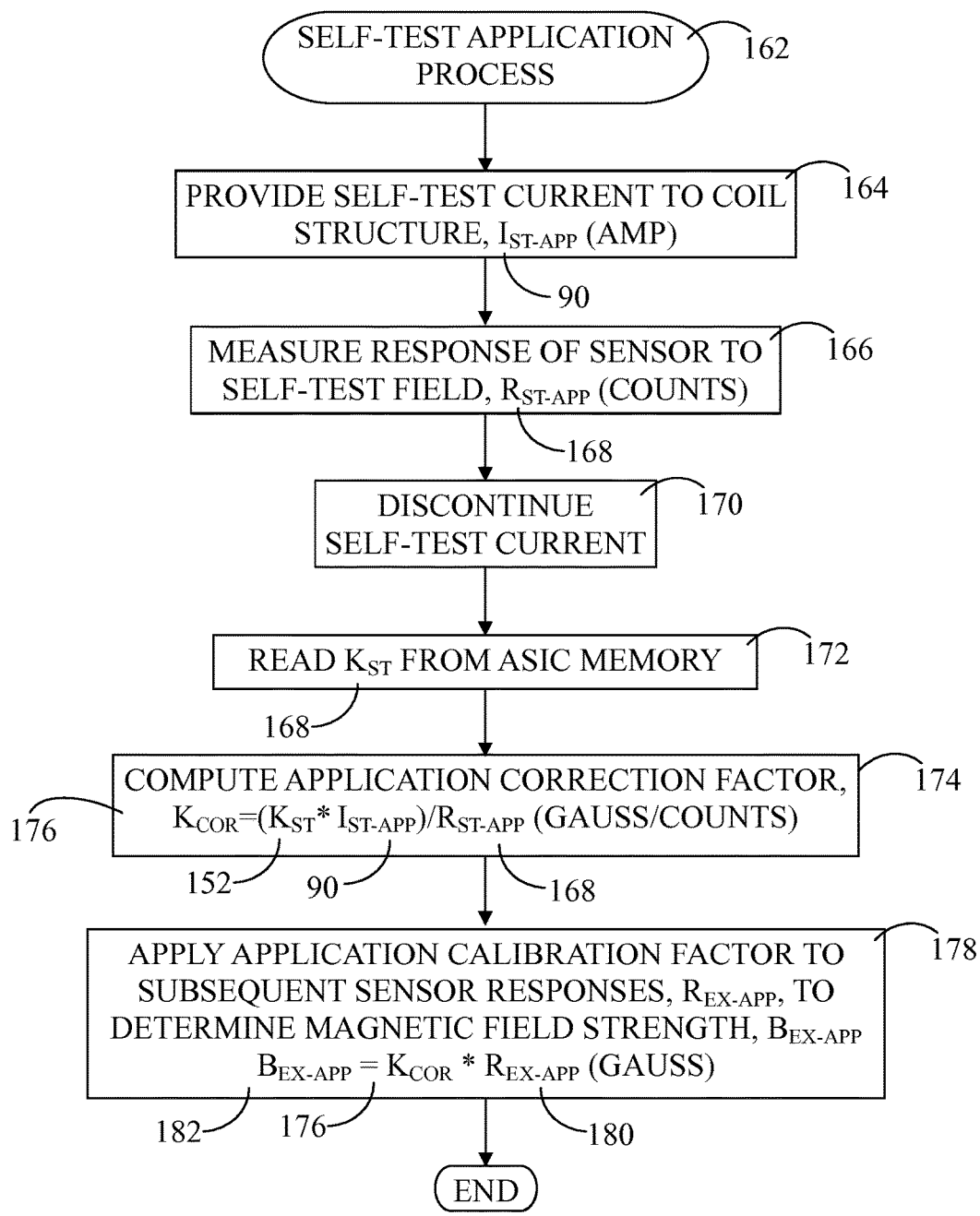
FIG. 13 shows a flowchart of a self-test application process utilizing the current carrying structure in accordance with yet another embodiment.

FIG. 13 shows a flowchart of a self-test application process 162 utilizing the current carrying structure in accordance with yet another embodiment. Self-test application process 162 will be described in connection with the configuration of FIG. 3 showing sensor package 60 having current carrying structure 63 with coil structure 64. Therefore, FIG. 3 should be referred to in connection with the ensuing methodology. In accordance with self-test application process 162, the self-test capability of sensor package 60 may be employed to calibrate sensor package 60 in the field, i.e., within an end-use application or structure.

Execution of self-test application process 162 entails providing self-test current 90 as an application current, $I_{ST-APP}$, to coil structure 64 (164), and measuring signal output 116 from Wheatstone bridge configuration 106 (see FIG. 9) (166). In this example, output signal 116 is represented at 166 by a response, $R_{ST-APP}$, 168 (in counts) to self-test magnetic field 92 (FIG. 4) resulting from self-test current 90. After response, $R_{ST-APP}$, 168, is measured, the provision of self-test current 90 may be discontinued (170).

Calibration factor 152, $K_{ST}$, previously stored in memory associated with ASIC 66 during execution of self-test calibration process 134 (FIG. 12), is read from ASIC 66 (172). An application specific correction factor may be computed (174) using response 168, self-test current 90, and correction factor 152. In this example, the application specific correction factor is represented at 174 by a correction factor, $K_{COR}$, 176 (in gauss/counts). Application specific correction factor 176 may then be applied to subsequent sensor responses to an externally applied magnetic field to determine magnetic field strength from Z-axis magnetic sensor 28 (178). Thereafter, self-test application process 162 ends. In this example, application sensor response is represented at 178 by a response, $R_{EX-APP}$, 180 and the magnetic field strength is represented at 178 by field strength, $B_{EX-APP}$, 182. In such a manner, self-test application process 162 may be implemented to calibrate sensor package 60 in the field, i.e., within an end-use application or structure, so as to calibrate Z-axis magnetic field sensor 28 taking into account the interaction of flux guides 44 and in-plane sense elements 32, 34, 70, 72.

FIGS. 11-13 provide exemplary processes for utilizing the self-test capability of sensor package 60 to test sensor functionality, to calibrate the sensor during final test, and to calibrate the sensor in the field. Moreover, in each instance, the self-test capability takes into account the interaction of flux guides 44 and in-plane sense elements 32, 34, 70, 72. Those skilled in the art will recognize that self-test process 124, self-test calibration process 134, and self-test application process 162 are exemplary in nature and can be readily modified to perform any suitable post processing and/or field testing of Z-axis magnetic field sensor 28 (FIG. 3) within sensor package 60.

It is to be understood that certain ones of the process blocks depicted in FIGS. 11-13 may be performed in parallel with each other or with performing other processes. In addition, it is to be understood that the particular ordering of the process blocks depicted in FIGS. 11-13 may be modified, while achieving substantially the same result. Accordingly, such modifications are intended to be included within the scope of the inventive subject matter. In addition, although particular system configurations are described in conjunction with FIGS. 3-10, above, embodiments may be implemented in systems having other architectures, as well. These and other variations are intended to be included within the scope of the inventive subject matter.

Thus, various embodiments of a sensor package that includes a Z-axis magnetic field sensor with Z-axis self-test capability and methodology for performing Z-axis self-test of the magnetic field sensor have been described. The magnetic field sensor includes a current carrying coil structure surrounding in-plane magnetoresistive sense elements. The coil structure produces a vertical (i.e., out-of-plane) magnetic field component across the active sensor region to properly stimulate all components of the Z-axis magnetic sensor. The coil structure may be vertically displaced from the in-plane sense elements. Accordingly, the coil structure also produces parasitic lateral (i.e., in-plane) magnetic field components that can be detected by the in-plane sense elements. Accordingly, a specific Wheatstone bridge configuration of the in-plane magnetoresistive sense elements and the locations of the in-plane magnetoresistive sense elements within the coil structure provide common mode rejection of parasitic lateral magnetic field components. Thus, the self-test capability enables testing of the interaction between the flux guides of a Z-axis magnetic field sensor and the in-plane magnetoresistive sense elements to allow for a complete evaluation of the Z-axis magnetic field sensor. The coil structure may be post-processed over the top of a magnetic-on-CMOS wafer to cost effectively enable implementation on either existing magnetic field sensor wafers or with new magnetic field sensor designs.

While the principles of the inventive subject matter have been described above in connection with specific apparatus and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A sensor package comprising:
   a magnetic field sensor, said magnetic field sensor comprising in-plane sense elements located in a plane of said magnetic field sensor and configured to detect a magnetic field oriented perpendicular to said plane, wherein all of said in-plane sense elements are located within an area of said magnetic field sensor;
   a continuous coil structure surrounding said area occupied by said in-plane sense elements such that an entirety of said continuous coil structure is laterally displaced outside of said area;
   circuitry coupled to said continuous coil structure, said circuitry being configured to provide an electric current to said continuous coil structure to apply a self-test magnetic field to be sensed by said in-plane sense elements, wherein a vector component of said self-test magnetic field is oriented approximately perpendicular to said plane of said magnetic field sensor; and
   at least one flux guide configured to direct said vector component of said self-test magnetic field into said plane.

2. The sensor package of claim 1 wherein said continuous coil structure is vertically displaced out of said plane in which said in-plane sense elements are located.

3. The sensor package of claim 1 wherein:
   said in-plane sense elements comprise a first magnetoresistive element and a second magnetoresistive element; and
   said at least one flux guide comprises:
      a first flux guide proximate said first magnetoresistive element and configured to guide said vector component of said self-test magnetic field into said plane in a first direction for detection at said first magnetoresistive element; and
      a second flux guide proximate said second magnetoresistive element and configured to guide said vector component of said self-test magnetic field into said plane in a second direction for detection at said second magnetoresistive element, said second direction being oriented opposite to said first direction.

4. The sensor package of claim 3 wherein:
   said in-plane sense elements further comprise a third magnetoresistive element and
   a fourth magnetoresistive element, wherein said first, second, third, and fourth magnetoresistive elements are electrically connected in a Wheatstone bridge configuration; and
   said at least one flux guide further comprises:
      a third flux guide proximate said third magnetoresistive element and configured to guide said vector component of said self-test magnetic field into said plane in said first direction for detection at said third magnetoresistive element; and
      a fourth flux guide proximate said second magnetoresistive element and configured to guide said vector component of said self-test magnetic field into said plane in said second direction for detection at said fourth magnetoresistive element.

5. The sensor package of claim 1 wherein said continuous coil structure comprises multiple serially connected coils entirely surrounding said area occupied by said in-plane sense elements.

6. A sensor package comprising:
   a magnetic field sensor, said magnetic field sensor comprising in-plane sense elements located in a plane of said magnetic field sensor and configured to detect a magnetic field oriented perpendicular to said plane, wherein all of said in-plane sense elements are located within an area of said magnetic field sensor, said in-plane sense elements comprising a first magnetoresistive element, a second magnetoresistive element, a third magnetoresistive element, and a fourth magnetoresistive element, wherein said first, second, third, and fourth magnetoresistive elements are coupled in a Wheatstone bridge configuration, and wherein said first and second magnetoresistive sense elements are connected in parallel, said first and fourth magnetoresistive sense elements are coupled in series, and said second and third magnetoresistive sense elements are coupled in series;
   a continuous coil structure surrounding said area occupied by said in-plane sense elements such that an entirety of said continuous coil structure is laterally displaced outside of said area, wherein said continuous coil structure comprises:
      a first segment;
      a second segment coupled with said first segment;
      a third segment coupled with said second segment; and
      a fourth segment coupled with said third segment, said first and third segments being located on first opposing edges of said area of said sensor package at which said in-plane sense elements are located, and said second and fourth segments being located on second opposing edges of said area, wherein said first and second magnetoresistive elements are positioned proximate said first segment, and said third and fourth magnetoresistive elements are positioned proximate said third segment; and
   circuitry coupled to said continuous coil structure, said circuitry being configured to provide an electric current to said continuous coil structure to apply a self-test magnetic field to be sensed by said in-plane sense elements.

7. The sensor package of claim 6 wherein said current is configured to generate said self-test magnetic field having a lateral vector component in a direction substantially parallel to said plane of said magnetic field sensor wherein the position of said first and second magnetoresistive elements proximate said first segment, and the position of said third and fourth magnetoresistive elements proximate said third segment results in a cancellation of said lateral vector component of said self-test magnetic field.

8. A sensor package comprising:
a magnetic field sensor, said magnetic field sensor comprising in-plane sense elements located in a plane of said magnetic field sensor and configured to detect a magnetic field oriented perpendicular to said plane, wherein all of said in-plane sense elements are located within an area of said magnetic field sensor, and wherein said in-plane sense elements include:
a first magnetoresistive element;
a second magnetoresistive element;
a third magnetoresistive element; and
a fourth magnetoresistive element, wherein said first, second, third, and fourth magnetoresistive elements are coupled in a Wheatstone bridge configuration, and wherein said first and second magnetoresistive sense elements are connected in parallel, said first and fourth magnetoresistive sense elements are coupled in series, and said second and third magnetoresistive sense elements are coupled in series;
a continuous coil structure surrounding said area occupied by said in-plane sense elements such that an entirety of said continuous coil structure is laterally displaced outside of said area and is vertically displaced out of said plane in which said in-plane sense elements are located;
circuitry coupled to said current carrying structure, said circuitry being configured to provide an electric current to said continuous coil structure to apply a self-test magnetic field to be sensed by said in-plane sense elements, wherein a vector component of said self-test magnetic field is oriented approximately perpendicular to said plane of said magnetic field sensor; and
at least one flux guide configured to direct said vector component of said self-test magnetic field into said plane.

9. The sensor package of claim 8 wherein said at least one flux guide comprises:
a first flux guide proximate said first magnetoresistive element and configured to guide said vector component of said self-test magnetic field into said plane in a first direction for detection at said first magnetoresistive element; and
a second flux guide proximate said second magnetoresistive element and configured to guide said vector component of said self-test magnetic field into said plane in a second direction for detection at said second magnetoresistive element, said second direction being oriented opposite to said first direction;
a third flux guide proximate said third magnetoresistive element and configured to guide said vector component of said self-test magnetic field into said plane in said first direction for detection at said third magnetoresistive element; and
a fourth flux guide proximate said second magnetoresistive element and configured to guide said vector component of said self-test magnetic field into said plane in said second direction for detection at said fourth magnetoresistive element.

10. The sensor package of claim 8 wherein said continuous coil structure comprises:
a first segment;
a second segment coupled with said first segment;
a third segment coupled with said second segment; and
a fourth segment coupled with said third segment, said first and third segments being located on first opposing edges of said area of said sensor package at which said in-plane sense elements are located, and said second and fourth segments being located on second opposing edges of said area, wherein said first and second magnetoresistive elements are positioned proximate said first segment, and said third and fourth magnetoresistive elements are positioned proximate said third segment.

11. The sensor package of claim 10 wherein:
said vector component of said self-test magnetic field is a first vector component;
said current is configured to generate said self-test magnetic field having said first vector component oriented substantially perpendicular to said plane of said magnetic field sensor and a second vector component oriented substantially parallel to said plane; and
the position of said first and second magnetoresistive elements proximate said first segment and the position of said third and fourth magnetoresistive elements proximate said third segment results in a cancellation of said second vector component of said self-test magnetic field such that each of said first, second, third, and fourth magnetoresistive sense elements detect said first vector component.

* * * * *